United States Patent
Telser et al.

(10) Patent No.: US 11,498,325 B2
(45) Date of Patent: Nov. 15, 2022

(54) METHOD FOR THE ADDITIVE PRODUCTION OF RELIEF PRINTING PLATES

(71) Applicant: Flint Group Germany GmbH, Stuttgart (DE)

(72) Inventors: Thomas Telser, Heidelberg-Wieblingen (DE); Eva Freudenthaler, Korntal-Münchingen (DE)

(73) Assignee: Flint Group Germany GmbH, Stuttgard (DE)

( * ) Notice: Subject to any disclaimer, the term of this patent is extended or adjusted under 35 U.S.C. 154(b) by 84 days.

(21) Appl. No.: 15/769,560

(22) PCT Filed: Oct. 21, 2016

(86) PCT No.: PCT/EP2016/075378
§ 371 (c)(1),
(2) Date: Apr. 19, 2018

(87) PCT Pub. No.: WO2017/068125
PCT Pub. Date: Apr. 27, 2017

(65) Prior Publication Data
US 2018/0304609 A1    Oct. 25, 2018

(30) Foreign Application Priority Data
Oct. 22, 2015  (EP) .................................. 15191051

(51) Int. Cl.
*B41C 1/00* (2006.01)
*G03F 7/00* (2006.01)
(Continued)

(52) U.S. Cl.
CPC ............ *B41C 1/003* (2013.01); *G03F 7/0035* (2013.01); *G03F 7/027* (2013.01); *G03F 7/2022* (2013.01)

(58) Field of Classification Search
CPC ....... B41C 1/003; G03F 7/0035; G03F 7/027; G03F 7/2022; G03F 7/16; G03F 7/36
See application file for complete search history.

(56) References Cited

U.S. PATENT DOCUMENTS

| 4,323,636 A |   | 4/1982 | Chen |
| 4,857,434 A | * | 8/1989 | Klinger .................. C08C 19/38 |
|  |  |  | 430/286.1 |

(Continued)

FOREIGN PATENT DOCUMENTS

| EP | 332070 A2 | 9/1989 |
| EP | 0641648 A1 | 3/1995 |

(Continued)

OTHER PUBLICATIONS

International Search Report for PCT/EP2016/075378 dated Feb. 24, 2017.

(Continued)

*Primary Examiner* — Jennifer Bahls
*Assistant Examiner* — Quang X Nguyen
(74) *Attorney, Agent, or Firm* — Faegre Drinker Biddle & Reath LLP (57) ABSTRACT

The invention relates to a process for the production of relief printing plates, where a carrier with a polymeric substrate layer is provided and a relief is formed layer-by-layer on a surface of the substrate layer, where the relief is formed by means of
a) single or multiple application of a liquid comprising at least one reactive monomer to the surface of the substrate layer,
b) diffusion of the reactive monomer into the polymeric substrate layer for a prescribed exposure time and
c) hardening of the relief,
where in step a) the liquid is applied in accordance with an image to the surface and where, after the prescribed expo- (Continued)

sure time of step b), any liquid that remains on the surface, having not diffused into the material, is removed from the surface, and in step c) the relief that is hardened comprises the polymer of the substrate layer and reactive monomer that has diffused into the material.

22 Claims, 6 Drawing Sheets

(51) Int. Cl.
  *G03F 7/027* (2006.01)
  *G03F 7/20* (2006.01)

(56) References Cited

U.S. PATENT DOCUMENTS

| | | | |
|---|---|---|---|
| 5,061,606 A | 10/1991 | Telser et al. | |
| 5,262,275 A | 11/1993 | Fan | |
| 6,641,772 B2 | 11/2003 | Gelbart | |
| 2004/0131778 A1 | 7/2004 | Verhoest et al. | |
| 2004/0161705 A1* | 8/2004 | Huang | B41C 1/003 430/306 |
| 2006/0054040 A1* | 3/2006 | Daems | B41C 1/003 101/463.1 |
| 2007/0259474 A1* | 11/2007 | Shin | H01L 51/0022 438/99 |
| 2008/0053326 A1 | 3/2008 | Murphy et al. | |
| 2011/0219973 A1* | 9/2011 | Gullentops | B41C 1/003 101/401.1 |

FOREIGN PATENT DOCUMENTS

| | | | | |
|---|---|---|---|---|
| EP | 1170121 A1 | 1/2002 | | |
| EP | 1239329 A2 | 9/2002 | | |
| EP | 1428666 A1 | 6/2004 | | |
| EP | 1552922 A1 | 7/2005 | | |
| EP | 1637926 A2 * | 3/2006 | | B41C 1/003 |
| EP | 2033778 A1 | 3/2009 | | |
| EP | 2199082 A1 | 6/2010 | | |
| WO | WO-2012175525 A1 | 12/2012 | | |
| WO | WO-2014095361 A1 | 6/2014 | | |

OTHER PUBLICATIONS

Written Opinion of the International Searching Authority for PCT/EP2016/075378 dated Feb. 24, 2017.

International Report On Patentability with Written Opinion and English Translation for International Application No. PCT/EP2016/075378, dated May 3, 2018.

* cited by examiner

Figure 6

METHOD FOR THE ADDITIVE PRODUCTION OF RELIEF PRINTING PLATES

CROSS-REFERENCE TO RELATED APPLICATIONS

This application is a national stage application (under 35 U.S.C. § 371) of PCT/EP2016/075378, filed Oct. 21, 2016, which claims benefit of European Application No. 15191051.0, filed Oct. 22, 2015, both of which are incorporated herein by reference in their entirety.

PRIOR ART

The invention relates to a process for the production of relief printing plates where a carrier with a polymeric substrate layer is provided and a relief is formed layer-by-layer on a surface of the substrate layer.

Relief printing plates, for example flexographic printing plates, are used by way of example for the printing of a very wide variety of packaging with low-viscosity printing inks. Printing inks used are mostly polar water- or alcohol-based printing inks. The printing process requires flexographic printing plates that are soft and resilient, and are resistant to polar flexographic printing inks.

Conventional flexographic printing plates therefore comprise a soft, resilient, nonpolar binder, mostly block copolymers based on styrene-isoprene or styrene-butadiene, in combination with monomers, plasticizers and one or more photoinitiators (see by way of example U.S. Pat. No. 4,323,636). This photopolymerizable layer generally has a thickness of a few millimeters and is located on a dimensionally stable carrier, mostly a PET sheet. The relief is produced by irradiating UV light through a film negative. During irradiation the irradiated regions crosslink, but the unirradiated regions of the flexographic printing plate remain soluble and are removed by leaching in a suitable organic solvent.

Another possible method of irradiating flexographic printing plates, an alternative to irradiation through a film, is irradiation through a mask produced by means of a laser. The thin ablatable mask layer is located on the photopolymerizable layer (see by way of example U.S. Pat. No. 5,262,275). Ablation in accordance with an image produces a mask through which irradiation of UV light then takes place.

In both cases, UV irradiation of the photopolymerizable layer through a film and through an integral mask produced by means of a laser, the relief must then be produced by leaching in suitable organic solvents (see by way of example EP 332 070).

When the relief is subjected to leaching, the crosslinked regions of the flexographic printing plate also undergo some degree of swelling. Said solvent must in turn be removed in a drying step. Because the PET carrier sheet is heat-sensitive, the maximal temperature for drying of the flexographic printing plates is 60° C. Long drying times are required here. Drying times from 30 minutes up to a number of hours are required, depending on the layer thickness of the flexographic printing plate.

There has therefore been no lack of attempts to develop flexographic printing plates amenable to more rapid development. By way of example, thermal development of flexographic printing plates is also possible (see by way of example EP 1 239 329 or EP 1 170 121). In those documents, the flexographic printing plates are heated up to the melting point after irradiation in accordance with an image. The unirradiated regions of the flexographic printing plate thus become tacky and are then removed via contact with a nonwoven fabric or a woven fabric. However, the process involves complicated apparatus, because successive removal of a plurality of layers is required in order to produce an adequate relief. The resolution of the resultant flexographic printing plates is moreover inferior to the resolution of solvent-leached flexographic printing plates.

It would therefore in principle be desirable to find a process in which the relief is produced additively (i.e. by build-up of a relief) rather than by a development step. It would thus be possible to achieve considerably faster and simpler production of a relief printing plate. Considerably less material would moreover be required, and the life-cycle assessment of a resultant printing plate would be substantially improved.

There are various known methods of using inkjets for layer-by-layer construction of reliefs for printing purposes (see by way of example EP0641648, US2004/0131778, EP2033778, WO2012/175525, WO2014/095361, US2008/0053326).

The general principle of these patents is application of a reactive monomer mixture, for example a monomer/photoinitiator mixture, in accordance with an image to a suitable substrate by means of an inkjet printing process, and immobilization or curing of said mixture by means of UV light as soon as possible thereafter, so that the droplets applied cannot spread or run. The relief is thus built up by successive application of a plurality of layers.

However, build-up of a flexographic printing plate by means of an inkjet printing process has important disadvantages. An inkjet printing head can only apply low-viscosity liquids. The limiting viscosity is usually <15 mPas. Only relatively small molecules can therefore be used to formulate the reactive monomer mixture. These monomers are not capable of forming a soft resilient, robust material of the type required for flexographic printing plates. Since the reactive monomers are mostly selected from acrylic or methacrylic esters, the resultant materials are either too hard or, although sufficiently soft, not resistant to the polar inks used in flexographic printing.

US2008/0053326 describes a process which applies and crosslinks resilient prepolymers or polymers by way of an inkjet printing process and achieves layer-by-layer build-up of material of the type typically used for reliefs in flexographic printing. The materials have to be heated, thus producing low-viscosity melts which can be applied by way of the inkjet process.

EP 1552922 avoids the viscosity problem in that solid particles are dispersed in a carrier liquid and this dispersion is then applied layer-by-layer in an inkjet printing process. However, this process in turn requires removal of the carrier liquid, and is therefore complicated.

U.S. Pat. No. 6,641,772 describes a stereolithography process which can achieve build-up of materials of the type typically used in flexographic printing. An IR laser is used here for spot-heating of a heat-sensitive resin solution or melt, which is thermally cured to give three-dimensional structures. The process requires complicated apparatus.

There is therefore a need for a process that is additive (i.e. achieves build-up of a relief) and which can produce a flexographic printing plate in a manner that is simple and reliable. In particular, there is a need for additive flexographic printing plates which have the required softness and resilience and the required resistance to swelling caused by ethanol-based or water-based printing inks.

Surprisingly, it has been found that a relief with good resistance to the printing inks and with the required softness and resilience is obtained if the reactive liquid applied is not immobilized or hardened by means of UV radiation as soon as possible after application, but instead sufficient time is allowed for diffusion of the reactive liquid into a suitable polymeric carrier material before the next liquid layer is applied, and hardening is carried out only after application of a number of layers, or all layers.

Accordingly, a process is proposed for the production of relief printing plates, where a carrier with a polymeric substrate layer is provided and a relief is formed layer-by-layer on a surface of the substrate layer. The relief is formed by means of a) single or multiple application of a liquid comprising at least one reactive monomer to the surface of the polymeric substrate layer,
b) diffusion of the reactive monomer into the polymeric substrate layer for a prescribed exposure time and
c) hardening of the relief, where in step a) the liquid is applied in accordance with an image to the surface and where, after the prescribed exposure time, any liquid that still remains on the surface, having not diffused into the material, is removed from the surface, and in step c) the relief that is hardened comprises the polymer of the substrate layer and reactive monomer that has diffused into the material.

The liquid applied to form the relief comprises at least one reactive monomer which, during the proposed process, diffuses into the substrate layer. Hardening, which immobilizes the reactive monomer, takes place only after the reactive monomer has been absorbed by the substrate layer. After hardening, no further diffusion of the reactive monomer takes place in the substrate layer. The result of penetration of the reactive monomer into the polymeric substrate layer is that, rather than build-up of the relief on the polymeric substrate layer, the polymeric substrate layer itself is raised and forms the relief, by virtue of the material that has diffused into same. Unlike in the processes of the prior art, the material of the relief is not provided solely by the liquid applied, or the reactive monomer, but instead the relief, or any individual relief layer, is built up by a mixture of material of the polymeric substrate layer with the reactive monomer. The material of the relief therefore derives from the combination of the reactive monomer present in the liquid with the material of the polymeric substrate layer.

The relief is built up layer-by-layer, and the number of layers used here for the relief depends on the height of each relief layer and on the desired total height, or desired depth, of the relief. The depth of the relief here depends on the intended use of the printing plate. Flexographic printing uses relief printing plates with a relief depth in the range from 300 μm to 3000 μm. Relief depth for the printing of flexible packaging is from 300 μm to 700 μm. Other applications, for example, in the electronics sector, where conductive structures are produced on a circuit board or other substrate, require relief printing plates with a relief depth in the range from 10 μm to 100 μm.

The steps of application of the liquid to the surface and diffusion of the reactive monomer into the substrate layer are repeated until the entire relief has been built up with any desired number of layers. Each individual relief layer here represents a horizontal section through the entire relief. Accordingly, in order to form a relief layer, the liquid is applied in accordance with an image to the surface in a manner that produces an application pattern prescribed by the required relief. The application pattern can by way of example be obtained in that horizontal sections through the geometry of the required relief are determined; the application pattern for a required relief layer here is determined via the disposition of the horizontal section through the geometry of the relief in the appropriate height or relief depth. The thicknesses of all of the relief layers here can be identical or different, as required in a particular variant of process. By way of example, it is possible to reduce the thickness of a relief layer as relief depth increases. Equally, it is conceivable to vary the properties of the relief layers with increasing relief depth via use of a different liquid which by way of example comprises a different reactive monomer.

The application of the liquid is followed by the diffusion of the reactive monomer into the polymeric substrate layer for a prescribed exposure time. The exposure time is typically in the range from 10 seconds to 3600 seconds. The exposure time here depends on the velocity of diffusion of the reactive monomer into the polymeric substrate layer, i.e. depends on the speed with which the polymeric substrate layer absorbs the reactive monomer. The diffusion velocity depends in turn on the reactive monomer used and on the material used for the polymeric substrate layer. Since the material of the relief is not intended to consist solely of the reactive monomer, it is preferable that the prescribed exposure time is such that, after expiry of the exposure time, the substrate layer has absorbed the reactive monomer applied. The reactive monomer is considered here to have been absorbed by the substrate layer if, after expiry of the exposure time, the quantity of reactive monomer still present on the surface of the polymeric substrate layer is less than 10% of the quantity applied. It is particularly preferable that, after expiry of the exposure time, the applied liquid and, respectively, the reactive monomer have been completely absorbed, and therefore no reactive monomer remains on the surface of the substrate layer.

In the event that, after expiry of the exposure time, reactive monomer remains present on the surface of the substrate layer, it is intended that the reactive monomer remaining on the surface is removed. The material of the relief is therefore formed from the material of the substrate layer and from the reactive monomer that has diffused into the substrate layer. The thickness of a relief layer accordingly depends on the diffusion velocity of the reactive monomer in the material of the substrate layer and the exposure time, and where appropriate on the quantity of the liquid applied and, respectively, the quantity of the reactive monomer applied.

The diffusion velocity of the reactive monomer in the substrate layer moreover influences the shape of the sides of the relief and, respectively, of a relief layer. The reason for this is that diffusion takes place not only in a direction perpendicular to the surface of the substrate layer but also in directions in the plane of the substrate layer. Steep sides are obtained when diffusion velocity is low and exposure times are short. The steepness of the sides decreases as exposure time increases and as diffusion velocities increase. For the uppermost relief layers which are applied last, it is therefore preferable to select a reactive monomer with lower diffusion velocity than for the lower relief layers which are applied first. Alternatively or in addition, it is preferable that exposure time selected for the uppermost relief layers which are applied last is shorter than for the lower layers of relief that are applied first. The replication sharpness is thus increased in the relief, but at the same time the time required for build-up of the entire relief is minimized.

In a preferred possible method, a reactive monomer with high diffusion velocity in the polymeric substrate layer is used first, and subsequently a different reactive monomer with a lower diffusion velocity in the polymeric substrate layer is used. It is thus possible, with an essentially identical exposure time for each of the relief layers, to begin by producing relatively thick layers, so that build-up of the entire relief is achieved as rapidly as possible. The reactive monomer is then changed to one with lower diffusion velocity for the more externally situated layers, in order to permit more precise replication of the desired image in the relief.

After application of the liquid comprising at least one reactive monomer and after expiry of the prescribed exposure time, hardening of the relief takes place in step c). When the relief is hardened, the reactive monomer forms a three-dimensional network with the polymer of the substrate layer, and no further diffusion of the reactive monomer can occur in the substrate layer. The exposure parameters required for hardening are typically dependent on the reactive monomer used and on any photoinitiators used. The hardening can by way of example be achieved via exposure to heat or radiation. It is preferable to use reactive monomers in combination with photoinitiators where these can be hardened via exposure to electromagnetic radiation, in particular to ultraviolet light. It is preferable here that the photoinitiators are present in the substrate layer, rather than being added to the liquid. The wavelength of ultraviolet light (UV light) is in the range from 100 nm to 400 nm. Particular preference is given here to reactive monomers which can be hardened via exposure to UVA radiation. The wavelength of UVA radiation is in the range from 320 nm to 400 nm. Any stickiness of the surface of the relief printing plate can then be eliminated by further hardening with UVC radiation. The wavelength of UVC radiation is in the range from 100 to 280 nm.

There can by way of example be a UV light source provided for hardening, in particular a light source radiating in the UVA region. By way of example, the UV light source can take the form of an LED (light-emitting diode) strip that is moved relative to the carrier in order to cover the entire surface thereof.

It is preferable that the steps a) to c) are implemented once. Preference is given here to single application of the liquid to the surface of the substrate layer in the step a). The application of the liquid in step a) is followed by the steps b) and c) in this sequence, so that the reactive monomer applied with the liquid diffuses into the substrate layer, and the relief, comprising the reactive monomer and comprising the material of the polymeric substrate layer, is then hardened.

In a preferred alternative thereto, the steps a) and b) are implemented from 2 to 100 times, and in each case here a step of diffusion into the material follows a step of application of the liquid, and hardening in step c) takes place after the final implementation of the step b).

In one possibility here, the hardening in step c) is also executed after every nth implementation of the steps a) and b), where n is a natural number and is from 2 to 10. The additional execution of the hardening in step c) here represents intermediate hardening which hardens and thus immobilizes the reactive monomer which has diffused into the polymeric substrate layer, thus suppressing any further diffusion, in the material of the polymeric substrate layer, of the reactive monomer that has already diffused into the material. Hardening here is preferably achieved in the same manner as the hardening provided after the application of all of the relief layers.

The application of the liquid in step a) can be achieved by any process which permits application of a liquid in accordance with an image, or structured application of a liquid, to a surface. The application structure here corresponds to the image to be replicated on the relief.

It is possible, by way of example, for the application of a layer of the reactive liquid, to apply a mask to the surface of the polymeric substrate layer, where the mask protectively covers those regions of the surface of the substrate layer to which no liquid is to be applied. Once the mask has been applied, the liquid is applied to the entire surface, whereupon the liquid reaches the surface of the polymeric substrate layer through the mask, and then the mask is removed. Removal of the mask here can take place directly after application of the liquid or only after expiry of the prescribed exposure time. Application to the entire surface can by way of example be achieved in that the carrier together with the mask applied on the polymeric substrate layer is drawn through a liquid bath or immersed in a liquid bath. Alternatively, application of the reactive liquid to the entire surface of the substrate layer covered by the mask can be achieved via doctoring, spray-application, or by means of a suitable roll-application process.

The liquid used in the process comprises at least one reactive monomer. The liquid can in particular also comprise a mixture of two or more different monomers. The liquid also optionally comprises a photoinitiator. Another term used for the liquid, by virtue of the reactive monomer present, is reactive liquid.

The selection of the at least one reactive monomer in relation to the carrier used is preferably such that the diffusion velocity of the reactive monomer in the material of the polymeric substrate layer is in the range from 0.5 µm/min to 100 µm/min, preferably in the range from 2 µm/min to 50 µm/min.

The diffusion velocity is usually temperature-dependent. It is preferable that the desired diffusion velocity of the reactive monomer in the material of the polymeric substrate layer is achieved at the temperature at which the liquid is applied to the surface of the substrate layer. By way of example, the liquid is applied at a temperature in the range from 20 to 120° C. The boiling point of the reactive monomer imposes a natural upper limit on the application temperature. The maximal application temperature is usually below the boiling point of the reactive monomer.

Reactive monomers can by way of example be ethylenically unsaturated compounds which can be cured by a free-radical route. Alternatively, the reactive monomers can also comprise epoxy functions or aziridine functions which can cure by a cationic mechanism.

Preferred monomers have at least one polymerizable ethylenically unsaturated double bond. The following have proven to be particularly advantageous: esters or amides of acrylic acid or methacrylic acid with mono- or polyfunctional alcohols, amines, aminoalcohols or hydroxyethers or -esters, esters of fumaric or maleic acid, or allyl compounds. Very particularly preferred monomers are mono-, di- and triacrylates, and also -methacrylates.

Examples of suitable monomers are methyl methacrylate, ethyl acrylate, propyl (meth)acrylate, butyl (meth)acrylate, 2-ethylhexyl acrylate, lauryl acrylate, butanediol di(meth)acrylate, hexanediol di(meth)acrylate, nonanediol di(meth)acrylate, dodecanediol di(meth)acrylate, trimethylolpropane tri(meth)acrylate, hydroxyethyl (meth)acrylate, ethylene glycol (meth)acrylate, ethylene glycol di(meth)acrylate, tri- and tetraethylene glycol (meth)acrylates, glycerol di(meth)acrylate, propylene glycol mono- and di(meth)acrylates, trimethylolpropane tri(meth)acrylate, pentaerythritol tetra (meth)acrylate, and also poly(ethylene oxide) acrylates and the corresponding methacrylates, and poly(propylene oxide) acrylates and the corresponding methacrylates.

Other suitable reactive monomers can be glycidyl (meth)acrylate, phenyl glycidic ether (meth)acrylate, benzyl (meth)acrylate, cyclohexyl (meth)acrylate, isobornyl (meth)acrylate, dihydrodicyclopentadienyl (meth)acrylate, limonene (meth)acrylate, hexene (meth)acrylate, dimethylaminoethyl (meth)acrylate and bisphenol A diglycidic ether di(meth)acrylate. The following are also suitable: acrylamides and methacrylamides, for example hexamethylenebis(meth)acrylamide. Examples of suitable fumarates are diethyl fumarate, dibutyl fumarate, dioctyl fumarate. Examples of suitable maleic acid derivatives are dibutyl maleate, dioctyl maleate, laurylmaleimide.

The following are also suitable: polyester (meth)acrylates, polyether (meth)acrylates, polyurethane (meth)acrylates, polybutadiene (meth)acrylates, polyisoprene (meth)acrylates. The acrylates and methacrylates can comprise further functional groups, for example amide groups, sulfonic ester groups or sulfonamide groups. The following are also suitable: partially fluorinated or perfluorinated acrylates and methacrylates and silicone acrylates.

Mixtures of a plurality of different monomers can, of course, also be used.

Selection of the monomer naturally also depends on the material of the polymeric carrier layer. If the process of the invention is to be used for build-up of nonpolar soft resilient flexographic printing plates, particularly preferred monomers are then ethylhexyl acrylate, hexanediol diacrylate, hexanediol dimethacrylate, dodecanediol diacrylate, dodecanediol dimethacrylate, cyclohexyl acrylate, cyclohexyl methacrylate, isobornyl acrylate, isobornyl methacrylate, and also dihydrodicyclopentadienenyl acrylate and the corresponding methacrylate.

The proportion of the at least one reactive monomer present in the liquid is preferably from 50% by weight to 100% by weight, in particular preferably from 80% by weight to 100% by weight. It is very preferable that the reactive liquid comprises more than 90% by weight of monomer.

The liquid can optionally also comprise further components. The further components are preferably selected from photoinitiators, plasticizers, emulsifiers, diffusion aids, solvents and surface-active substances. Surface-active substances can by way of example be used to control the wetting behavior of the liquid on the surface of the polymeric substrate layer.

The liquid can optionally comprise a photoinitiator. The quantity of photoinitiator in the liquid can be from 0% by weight to 10% by weight.

The carrier used is preferably composite material and typically comprises, alongside the polymeric substrate layer, a dimensionally stable carrier, for example a dimensionally stable carrier sheet such as a polyester sheet or a metal sheet such as aluminum or steel. In an embodiment of the invention, the carrier is a dimensionally stable cylinder sleeve. Arranged between the dimensionally stable sheet, the dimensionally stable metal carrier or the dimensionally stable cylinder sleeve and the substrate layer there can optionally be further intermediate layers. This type of intermediate layer can by way of example be an adhesion-promoting layer.

Polyethylene terephthalate (PET), polybutylene terephthalate (PBT), polyethylene naphthalate (PEN) or polycarbonate (PC) can be used as material for the dimensionally stable carrier sheet. PET sheets of thickness from 100 to 200 µm are in particular suitable.

If the relief printing plate is a flexographic printing element having a cylindrical shape (sleeve), dimensionally stable cylinder sleeves that can be used are not only cylindrical polyester sleeves but also glass-fiber-reinforced polyester sleeves and other cylindrical carrier materials, for example nickel sleeves.

The binder of the polymeric substrate layer is selected in essence in accordance with the requirements of the respective printing process. The process of the invention is not restricted to the flexographic printing process. If the intention is by way of example to produce hard relief printing plates which are used in the letterpress printing process or in the intaglio printing process, then hard polymers will be used as binders for the carrier layer, examples being polyvinyl alcohol, partially or highly hydrolyzed polyvinyl acetates or polyamides.

Materials used as binders of the polymeric substrate layer for achieving the soft resilient properties of the printing plate that are typical for flexographic printing are preferably soft elastomeric materials.

Examples of soft elastomeric materials that can be used are polybutadiene, polyisoprene, copolymers of butadiene and styrene, copolymers of isoprene and styrene, styrene-butadiene block copolymers, styrene-isoprene block copolymers, styrene-ethylene/butylene block copolymers, styrene/isoprene/butadiene/styrene block copolymers, ethylene-propylene-diene rubbers, silicone rubbers, natural rubbers, chloroprene rubbers, nitrile rubbers, polyisobutylene and soft resilient polyurethanes.

It is preferable to use thermoplastically processable elastomeric block copolymers. The thermoplastic-elastomer block copolymers comprise at least one block consisting essentially of alkenyl aromatics and at least one block consisting essentially of 1,3-dienes. The alkenyl aromatics can by way of example be styrene, α-methylstyrene or vinyltoluene. Preference is given to styrene. The 1,3-dienes are preferably butadiene and/or isoprene. These block copolymers can be linear, branched or radial block copolymers. They are generally three-block copolymers of A-B-A type, but they can also be two-block polymers of A-B type, or block polymers having a plurality of alternating elastomeric and thermoplastic blocks, e.g. A-B-A-B-A. It is also possible to use mixtures of two or more different block copolymers. Commercially available three-block copolymers frequently comprise certain proportions of two-block copolymers. The diene units can have 1,2-linkages or 1,4-linkages. It is moreover also possible to use thermoplastic-elastomer block copolymers having terminal blocks made of styrene and having a random styrene-butadiene central block. Mixtures of a plurality of thermoplastic-elastomer block copolymers can, of course, also be used.

It is moreover possible to use thermoplastically processable elastomeric block copolymers which are partially fluorinated or perfluorinated or which incorporate fluorinated pendant chains. These polymers provide, to the substrate layer, an ink-repellent property which is advantageous during low-relief printing—in particular in applications in the electronics sector.

The thermoplastic elastomeric material of the polymeric substrate layer preferably consists mainly of a polymer selected from poly(styrene-butadiene-styrene) (SBS), poly(styrene-isoprene-styrene) (SIS), ethylene-propylene-diene rubber (EPDM) and other SB block copolymers. Other materials with good suitability are poly(styrene-butadiene/styrene-styrene) block copolymers which are commercially available with the trademark Styroflex®.

The total quantity of binders or polymers used in the polymeric substrate layer is usually from 50 to 100% by weight, based on the entirety of all of the constituents of the substrate layer, preferably from 50 to 90% by weight and particularly preferably from 60 to 85% by weight.

It is preferable that the polymeric substrate layer comprises one or more photoinitiators. Suitable photoinitiators or photoinitiator systems comprise benzoin or benzoin derivatives, for example methylbenzoin or benzoin ethers, benzil derivatives, such as benzil ketals, acylarylphosphine oxides, acylarylphosphinic esters, polynuclear quinones, or benzophenones. The quantity of photoinitiator in the polymeric substrate layer is generally from 0.1 to 10% by weight, preferably from 1 to 5% by weight and particularly preferably from 1.5 to 3% by weight, based on the quantity (weight) of all of the constituents of the substrate layer.

If the material of the polymeric substrate layer comprises a photoinitiator, it is preferable that the liquid comprising the reactive monomer is free from photoinitiators. Because, after application to the surface of the substrate layer, the reactive monomer diffuses into same, and the photoinitiator is already present in the substrate layer, there is no need to add any photoinitiator to the liquid. Omission of photoinitiator in the liquid permits easier and safer handling of said liquid, because there is less risk of undesired hardening before application to the substrate layer.

The material used for the polymeric substrate layer is preferably free from reactive monomers or comprises less than 10% by weight of reactive monomers. Since the reactive monomers diffuse, with the liquid, into the polymeric substrate layer, there is no requirement for the polymeric substrate layer to comprise reactive monomers. Minimized content of reactive monomers in the polymeric substrate layer is moreover advantageous because the properties of the resultant relief are then in essence determined by the binder or the material of the polymeric substrate layer.

However, it can be advantageous for reasons associated with printing technology that a small quantity of reactive monomer, preferably less than 10% by weight, is present in the polymeric substrate layer. After build-up and hardening of the relief, all regions of the relief printing plate are hardened, rather than only the raised parts of the relief, and a relief printing plate is thus produced with uniform mechanical properties in the base of the relief and in the raised regions of the relief.

The polymeric substrate layer can optionally comprise one or more plasticizers. Examples of plasticizers comprise paraffinic, naphthenic or aromatic mineral oils, synthetic oligomers or resins, for example oligostyrene, high-boiling-point esters, oligomeric styrene-butadiene copolymers, oligomeric α-methylstyrene/p-methylstyrene copolymers, liquid oligobutadienes, liquid polyisoprenes, in particular those with average molar mass from 500 to 5000 g/mol, and liquid oligomeric acrylonitrile-butadiene copolymers and oligomeric ethylene-propylene-diene copolymers. Preferred plasticizers comprise white oil, butadiene oil and paraffin oil.

The quantity of all plasticizers in the polymeric substrate layer is generally from 1 to 50% by weight and preferably from 1 to 30% by weight. The quantity of the plasticizers also depends on the respective binder system. Quantities of plasticizer that have proven successful in relief printing plates based on a styrene-isoprene binder system are from 1 to 10% by weight. Quantities of plasticizer that have proven successful in relief printing plates based on a styrene-butadiene binder system are from 20 to 40% by weight.

The polymeric substrate layer can optionally also comprise further additives, for example mineral fillers, pigments, dyes, or additional compressible materials. Examples of fillers with good suitability are silicates and powdered quartz, which change the surface topography of the substrate layer and can influence ink transfer during printing. The compressibility of the substrate layer can be increased by adding hollow microspheres.

The quantity of fillers is usually less than 50% by weight, preferably less than 20% by weight, based on all of the components of the polymeric substrate layer.

The polymeric substrate layer can moreover comprise surface-active substances, for example waxes, silicone oils or fluorinated compounds. As described above, for low-relief printing plates—such as those used in the electronics sector—it can be necessary to provide ink-repellent properties to the surface of the polymeric substrate layer. This is achieved by adding surface-active substances which diffuse to the surface of the polymeric substrate layer, where they form a hydrophobic, i.e. ink-repellent, protective film. However, the protective film should be permeable to the monomer, since otherwise no diffusion is possible, and no build-up of relief is possible.

The proportion of surface-active substances in the polymeric substrate layer is usually less than 5% by weight, preferably less than 2% by weight.

On the surface of the polymeric substrate layer there is usually also a protective top sheet which is removed before use, i.e. before the reactive liquid is applied. PET sheets of thickness from preferably 50 μm to 150 μm again have good suitability. In order to ensure easy removal of the top sheet, the top sheet can be provided with a release coating, or a siliconized top sheet can be used.

The thickness of the polymeric substrate layer depends in essence on the particular application or on the desired relief height. The thickness of the polymeric substrate layer should generally be greater than the desired relief height. For applications in the electronics sector, where small relief heights are required, polymeric substrate layers of thickness from 0.1 mm to 1.0 mm can be used. Typical flexographic printing requires relief heights of from 0.3 mm to 3.0 mm. The thickness of the polymeric substrate layers should then correspondingly be at least 0.5 mm to 3.0 mm. For printing onto corrugated cardboard, substrate layers of even greater thickness, up to 6 mm, can be used.

The polymeric substrate layer is produced either by casting from solution or from the melt via extrusion and calendering. Uniformity of layer thickness of the polymeric substrate layer across the width of the coating and the length of the coating is of decisive importance for the applications of the invention. The maximum layer thickness deviation for layer thicknesses below 1 mm should be plus/minus 10 μm. For layer thicknesses of from 1 mm to 3 mm, the layer thickness deviation should be at most plus/minus 15 μm.

It is preferable that the diffusion velocity of the respective monomer or of the respective monomer mixture in the respective polymeric substrate material is determined experimentally before implementation of the invention. It is thus possible to predict the exposure time required for build-up of a desired relief height. If the intention is successive application of a plurality of relief layers, it is preferable also to determine how the diffusion velocity of the respective monomer changes when the polymeric substrate layer comprises monomer that has already diffused into the material. In the event of successive application of a plurality of relief layers, with intermediate curing, it is then preferable to determine the diffusion velocity experimentally on correspondingly prepared substrate layers which comprise monomer that has already diffused into the material, and which have been hardened. The diffusion velocity of a monomer usually decreases when diffusion takes place through a polymer network that has already been hardened.

Another aspect of the invention provides a device for the production of relief printing plates. The device is preferably designed and/or configured to carry out the process described herein. Accordingly, features described for the purposes of the process apply correspondingly to the device, and the features described for the purposes of the device apply correspondingly to the process. The device comprises means for the application, in accordance with an image, of a reactive liquid to the surface of a carrier with a polymeric substrate layer, and also means for the hardening of the reactive liquid that has diffused into the carrier layer. The device is moreover configured to execute one of the processes described herein.

The means for the hardening of the reactive liquid that has diffused into the material preferably take the form of a UV light source which can irradiate the surface of the carrier. It is particularly preferable that the UV light source takes the form of an LED strip which spans the width of the carrier and can be moved relative to the carrier.

The device preferably moreover comprises means for the calculation of application patterns, where an application pattern prescribes those regions of the surface to which the reactive liquid is applied.

The examples below illustrate the invention and the process of the invention.

The following starting materials were used (all % data in % by weight):

Quintac 3621C, radial styrene-isoprene-styrene block copolymer having 15% of styrene from Nippon Zeon.

Kraton KX405, linear styrene-butadiene-styrene block copolymer having 24% styrene content from Kraton.

Styroflex 2G66, a styrene-butadiene/styrene-styrene block copolymer having 65% styrene content from Styrolution.

Nordel IP4725P, an EPDM rubber having 70% of ethylene, 25% of propylene and 5% of ethylidenenorbornene from Dow.

BDK, benzil dimethyl ketal from BASF.

Winog 70 white oil, paraffinic white oil from Shell.

Nisso PB1000, polybutadiene oil having >85% 1,2-vinyl content from Nippon Soda.

Hexamoll DINCH, diisononyl 1,2-cyclohexanedicarboxylate from BASF.

Syloid ED50, amorphous silicon dioxide, average particle size about 8 µm, from Grace.

HDDA, hexanediol diacrylate, HDMA2, hexanediol dimethacrylate, EHA, 2-ethylhexyl acrylate, monomers from BASF.

EXAMPLES

Experimental Determination of Diffusion Velocities of Selected Monomers in Selected Polymeric Substrate Materials The polymeric substrate layers described in table 1 (all data in table 1 being in % by weight) were produced as follows. The respective binders, with the stated plasticizers and in each case 5% by weight of photoinitiator, were melted and homogenized in a ZSK 53 twin-screw extruder, and discharged through a slot die, and then calendered between two PET sheets. A siliconized Mylar PET sheet, thickness 100 µm, was used as top sheet. A Melinex D 740 carrier sheet, thickness 125 µm, which had previously been coated with an isocyanate-based adhesive lacquer layer of thickness about 5 µm, was used as carrier sheet. The total thickness of the composite made of carrier sheet, polymeric substrate layer and top sheet was 1.8 mm. The composite was drawn off on a vacuum suction belt and, after cooling, cut to size to give individual sheets.

TABLE 1

|  | S-I-S block copolymer | S-B-S block copolymer | EPDM rubber | S-B/S-S block copolymer |
|---|---|---|---|---|
| Quintac 3621C | 85% | | | |
| Kraton KX405 | | 75% | | |
| Nordel IP 4725P | | | 75% | |
| Styroflex 2G66 | | | | 75% |
| BDK | 5% | 5% | 5% | 5% |
| Winog 70 white oil | 10% | | 20% | |
| Nisso PB 1000 | | 20% | | |
| Hexamoll DINCH | | | | 20% |

Diffusion velocities were determined by, in each case, applying a macroscopic droplet of a monomer by means of a metering syringe (volume 50 µl) to a selected carrier material. The droplet was allowed to remain on the polymeric substrate layer for a defined exposure time. Excess monomer was then removed by rinsing with isopropanol, and the resultant relief was fixed by irradiation with UVA light (10 minutes of exposure to light from tubular, nyloflex FIII lamps from Flint Group). The surface was then irradiated with UVC light (nyloflex F III lamps) for a further 3 minutes in order to render the surface non-sticky, and a Perthometer was used to measure the resultant relief.

Figure 1:
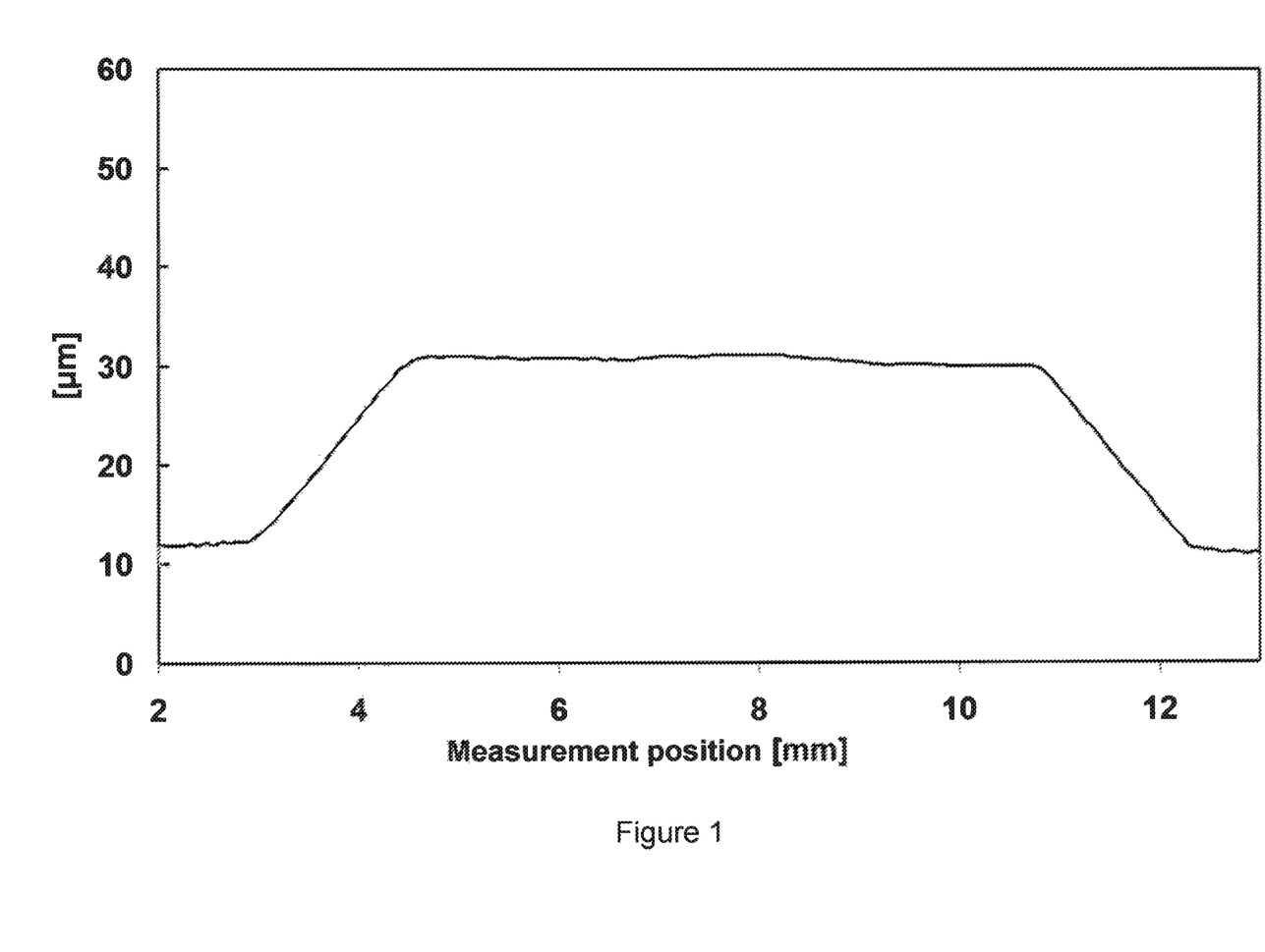
FIG. 1 shows a plateau formed by the diffusion of a droplet into the material.

FIG. 1 shows an example of measurement at a temperature of 30° C., based on a droplet, using HDDA as monomer and, as carrier material, the SIS-based carrier material from table 1. Diffusion time was 20 minutes. A resultant height of the relief of 20 µm can be determined from the plot.

If the experiment is carried out for various exposure times, it is then surprisingly found that the height of the resultant relief increases in proportion with the diffusion time. Diffusion of the monomer into the polymeric carrier layer is therefore not adversely affected by any saturation concentration. From the gradient of the straight lines it is possible to determine a diffusion velocity in µm per unit of time for a given monomer/substrate pairing. Table 2 shows the diffusion velocities determined for selected monomers and the polymeric substrates from table 1 at room temperature (22° C.). It should be noted that the diffusion velocities thus determined are not precisely scientifically defined, but rather represent an empirically determined diffusion velocity which can be used for calculations relating to the build-up of a relief by the process of the invention.

TABLE 2

| Polymer carrier layer | Monomer | Diffusion velocity in μm/min |
|---|---|---|
| S-I-S | HDDA | 0.7 |
| S-I-S | HDMA | 1.3 |
| S-I-S | EHA | 4.4 |
| S-B-S | HDDA | 2.2 |
| S-B-S | HDMA | 3.2 |
| S-B-S | EHA | 3.9 |
| S-S/B-S | HDDA | 1.7 |
| S-S/B-S | HDMA | — |
| S-S/B-S | EHA | 3.9 |
| EPDM | HDDA | — |
| EPDM | HDMA | — |
| EPDM | EHA | 2.0 |

Within the limits imposed by accuracy of measurement, it was not possible to determine diffusion velocities for all monomer/substrate pairings. In the case of the very nonpolar carrier layer based on EPDM rubber, measurable diffusion was determinable only for the comparatively nonpolar material EHA.

Build-Up of a Plurality of Relief Layers

The following experiments were carried out in order to simulate the application of a plurality of mutually superposed relief layers in accordance with an image. 20 μl of a 1:1 mixture of HDA2 and HDMA2 were applied in droplet form at 30° C. to a carrier layer based on S-I-S rubber (see table 1 for composition) into which 2% by weight of amorphous silicon dioxide (Syloid ED 50) had also been incorporated as filler, and the droplets were allowed to remain on the carrier layer for precisely 2 minutes. The carrier layer was then immersed in isopropanol in order to remove excess monomer, and blow-dried by means of compressed air. A 2 μl droplet of the same monomer mixture was then applied to the center of the resultant circular relief plateau, and again allowed to remain on the plate for precisely 2 minutes at 30° C. The plate was then again immersed in isopropanol and blow-dried. The plate was then irradiated for 10 minutes with UVA light and then for 3 minutes with UVC light (nyloflex F III lamps), and the resultant relief was fixed, and the surface was detackified.

Figure 2:
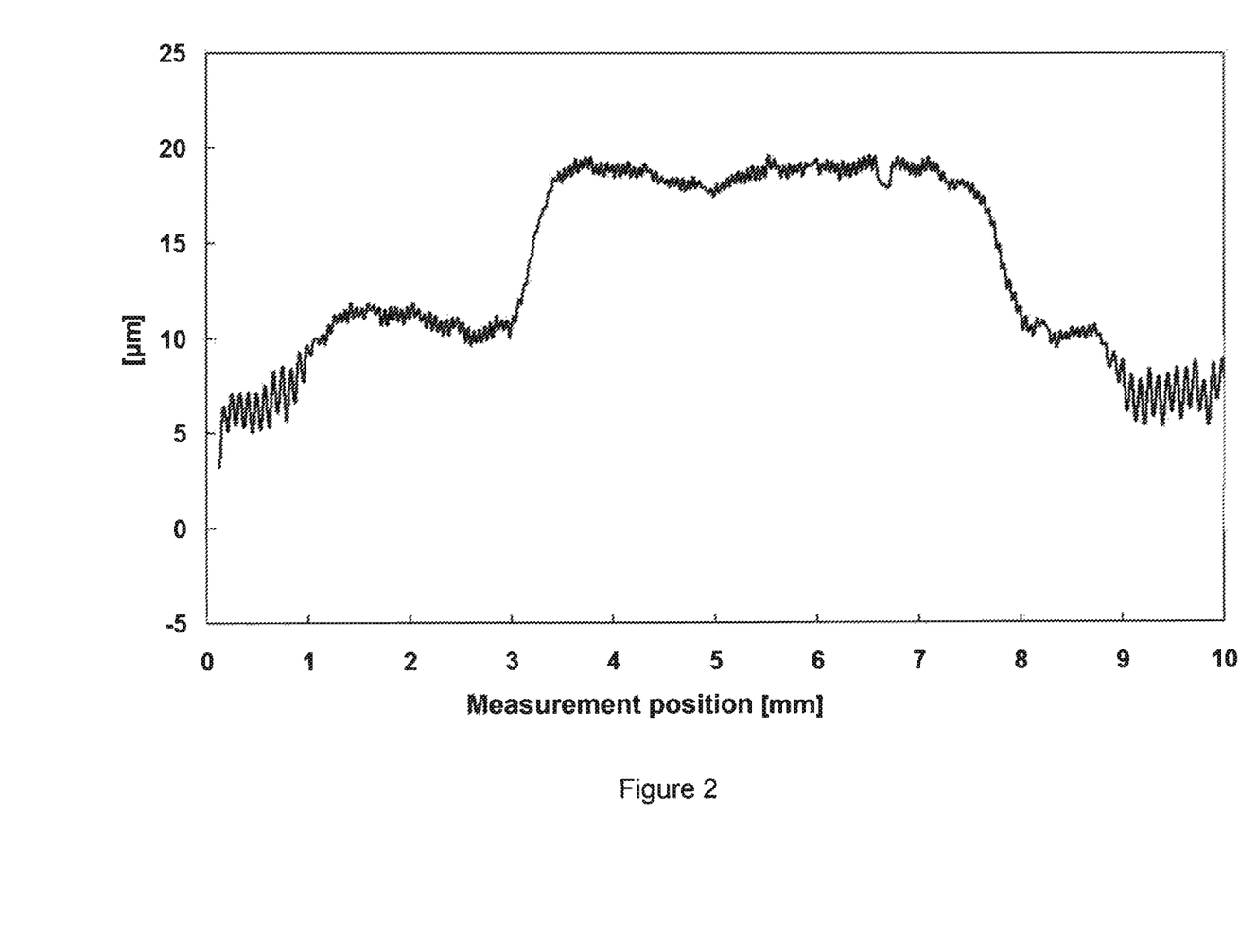
FIG. 2 shows a measured relief built up from two relief layers without immobilization.

FIG. 2 shows the profile of the resultant relief, measured by a Perthometer. Two plateaus are discernible. The relief height of the first plateau is about 7 μm, and the relief height of the second plateau is higher, being about 10 μm. Diffusion of the monomer mixture into the substrate material into which monomer has already diffused therefore takes place more rapidly than into a substrate material comprising no monomer.

Figure 3:
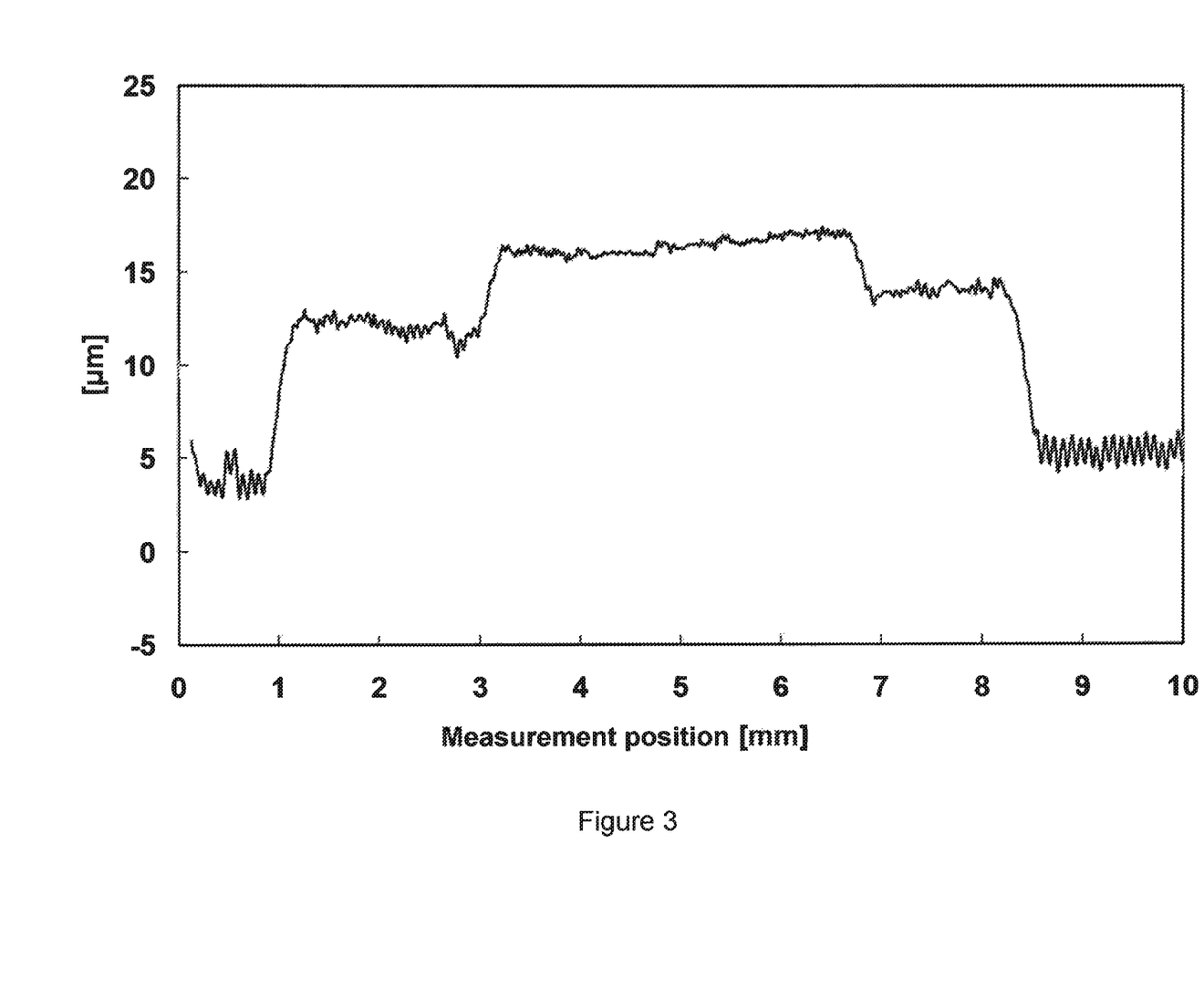
FIG. 3 shows a measured relief built up from two relief layers with immobilization.

The experiment was repeated with the difference that, before application of the second droplet, a brief intermediate irradiation (30 seconds of UVA irradiation, nyloflex FIII lamps) was carried out in order to immobilize the monomers that had diffused into the material and to fix the first relief stage. FIG. 3 shows the corresponding Perthometer-measurement profile. The relief height of the first plateau is about 8 μm. The relief height of the second plateau is now smaller, being about 5 μm. The relief edges are significantly sharper. The monomers that have diffused into the material in the first stage are immobilized by the intermediate irradiation, and can no longer diffuse laterally; a steeper relief edge is thus formed. The monomers that have diffused into the material in the first stage crosslink with the polymeric binder of the carrier layer and form a three-dimensional network; subsequent diffusion is thus retarded.

The experiments show that a relief can be built up layer-by-layer via repeated diffusion of the monomers. In order to calculate the relief height in advance, it is necessary to determine the diffusion velocities of the monomer(s) into the respective polymeric carrier layer individually for each relief layer that is to be applied.

Mask Experiments

Experiment 1

Holes measuring 1 mm, 3 mm and 10 mm were punched into an aluminum sheet of thickness about 0.5 mm to produce a template. This template was placed onto the SIS-based carrier layer (table 1) and loaded with weights at the edges in order to ensure intimate contact between mask and surface of the polymeric carrier layer.

The holes in the template were filled with HDA2 at room temperature (22° C.). After a diffusion time of 60 minutes, the template was removed from the carrier layer. Excess monomer was removed by washing with isopropanol, and the relief plate was blow-dried with compressed air. The relief was then fixed by irradiation with UVA light (10 minutes, nyloflex F III lamp), and the surface was detackified by means of UVC irradiation (3 minutes, nyloflex F III lamp). A Perthometer was used to measure the resultant relief (see FIGS. 4, 5 and 6).

Figure 4:
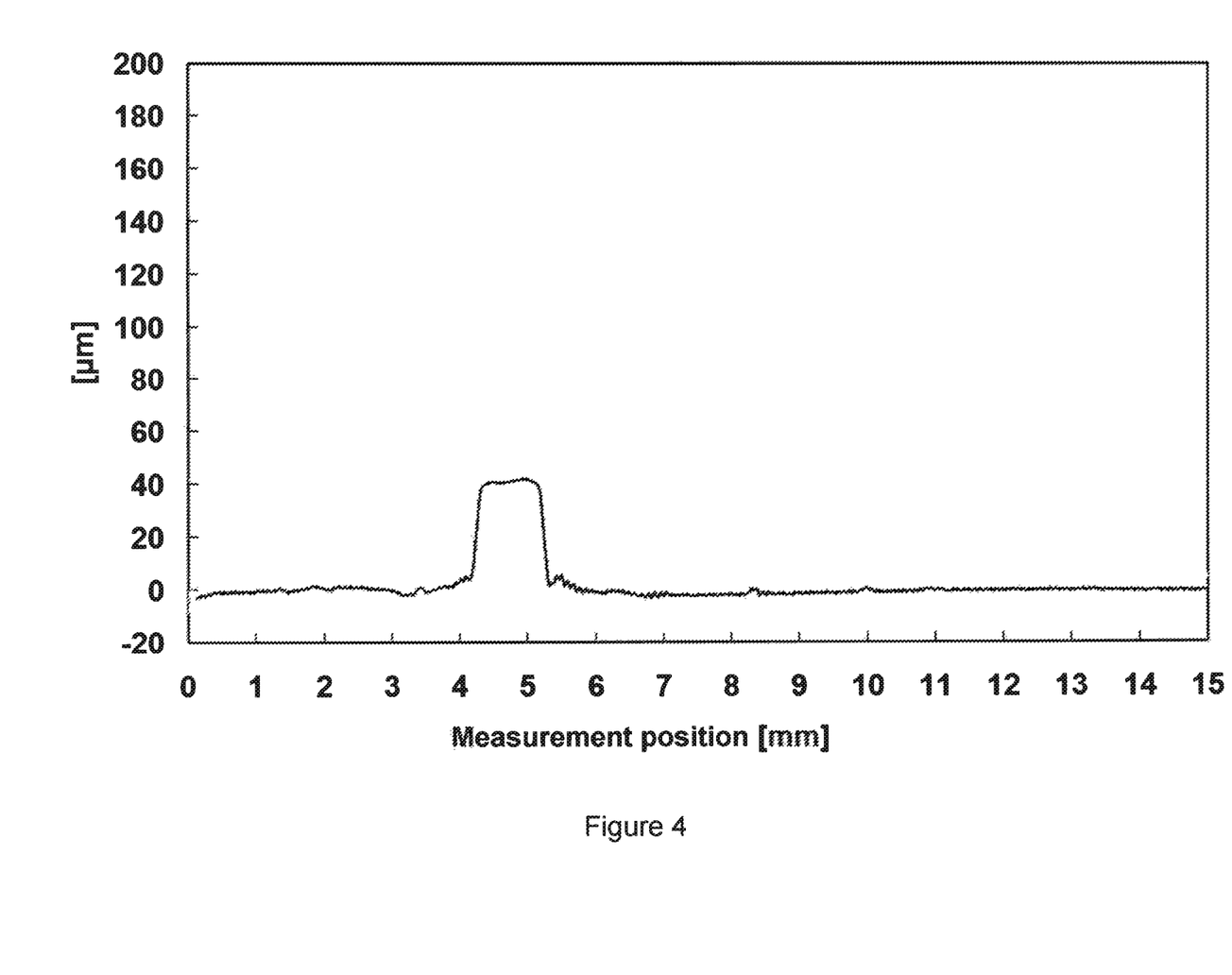
FIG. 4 shows a measured relief, experiment 1, diffusion through 1 mm perforated template.
Figure 5:
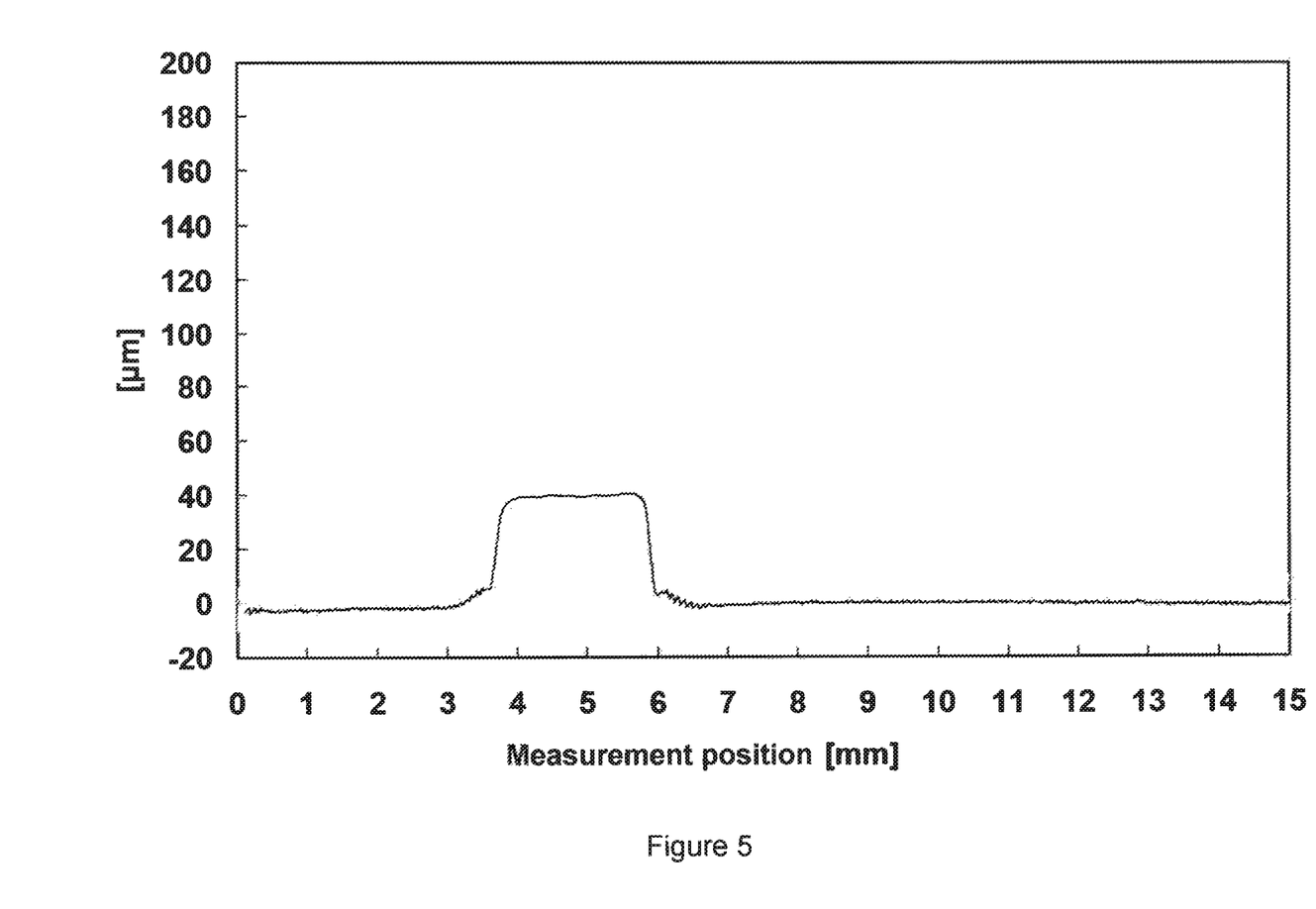
FIG. 5 shows a measured relief, experiment 1, diffusion through 3 mm perforated template
Figure 6:
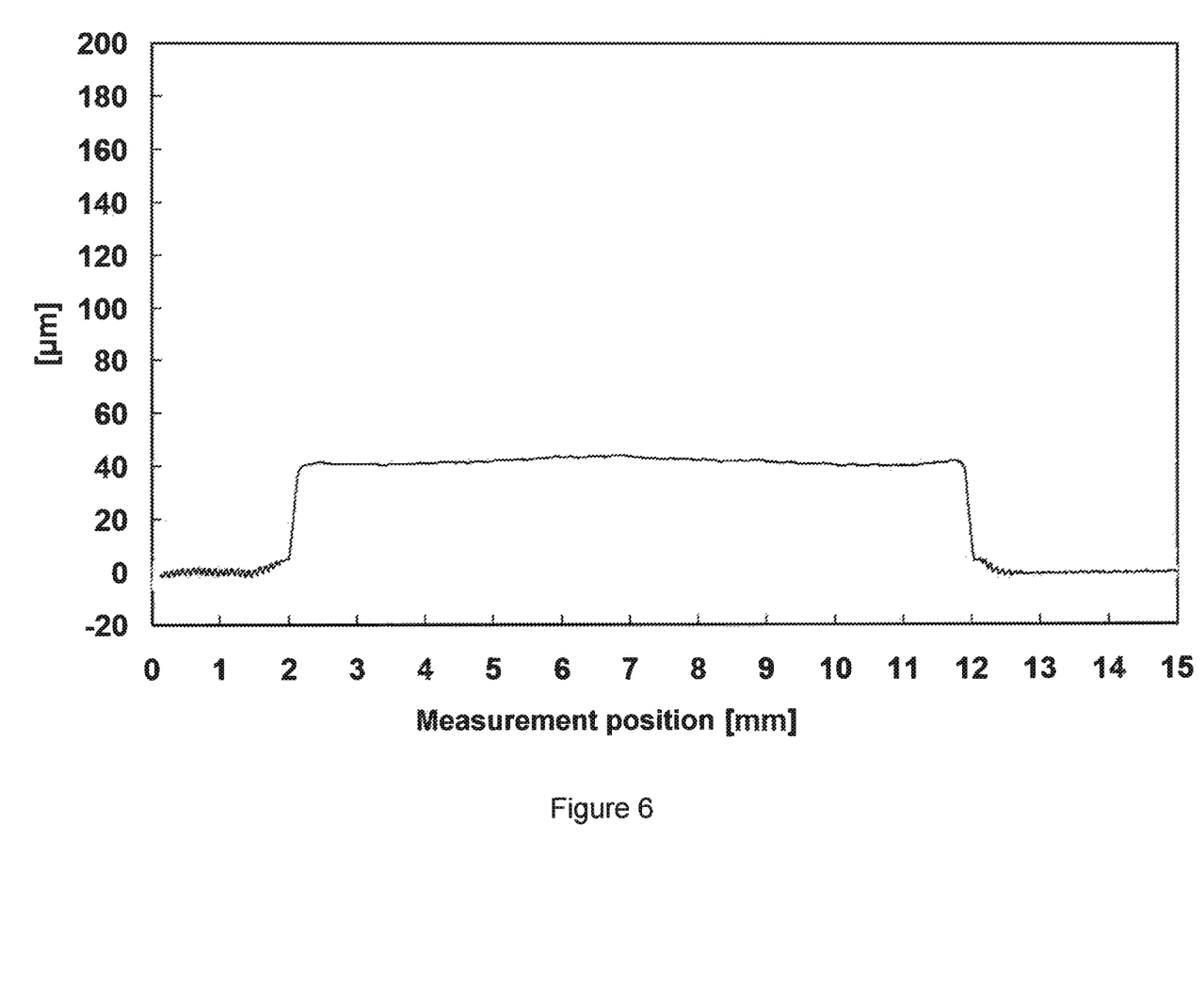
FIG. 6 shows a measured relief, experiment 1, diffusion through 10 mm perforated template.

The built-up spots had steep sides. The spot surfaces were level and uniform. The relief heights determined were 42 μm (10 mm spot), 42 μm (3 mm spot) and 40 μm (1 mm spot).

Experiment 2

Experiment 1 was repeated, except that the temperature for diffusion of the monomer into the material was set to 40° C.

Again, the built-up spots had steep sides and a level, uniform surface. Relief height was greater because of the higher diffusion velocity. The relief heights were 108 μm (10 mm spot), 106 μm (3 mm spot) and 108 μm (1 mm spot).

A compressible adhesive tape was then used to bond the relief printing plate to the cylinder of a flexographic printing machine, and alcohol-based ink was used for printing. Table 3 collates the printing parameters.

TABLE 3

| | |
|---|---|
| Printing machine | F&K FP 6S/8 |
| Substrate | PE sheet |
| Printing ink | Siegwerk NC4012 cyan |
| Viscosity of printing ink | 22 sec |
| Anilox roll | 460 l/cm, 3.5 g/cm³ |
| Adhesive tape | Lohmann 5.3 |
| Print velocity | 80 m/min |
| Print setting | +30 μm in relation to kiss print |

Printout of all of the relief spots was uniform with the print setting selected. Each printed spot exhibited full coverage and no excessive squeeze edge. The diameters of the surface of the spots on the printing plate and in the printed image were determined microscopically at the start of printing and after 500 prints. Micro-Shore-A hardness was moreover measured on the surface of the spots (see Table 4).

TABLE 4

| | Template hole diameter | | |
|---|---|---|---|
| | 1 mm | 3 mm | 10 mm |
| Upper spot diameter on printing plate | 0.74 mm | 2.55 mm | 9.40 mm |
| Printed spot diameter (start of printing) | 0.82 mm | 2.73 mm | 9.62 mm |

TABLE 4-continued

| | Template hole diameter | | |
|---|---|---|---|
| | 1 mm | 3 mm | 10 mm |
| Printed spot diameter (end of printing) | 0.80 mm | 2.75 mm | 9.58 mm |
| Micro-Shore-A hardness | Not measurable | 68 | 67 |

The diameters of the relief spots at the surface are in all cases smaller than the respective template hole diameter. In contrast, the diameters of the printed spots are larger, by from 0.1 mm to 0.2 mm, than the spot diameters on the relief printing plate. This increase is typical of flexographic printing and can be attributed to squeeze effects relating to the low-viscosity flexographic printing ink. Within the limits imposed by accuracy of measurement, it was not possible to discern any swelling of the printing plate via the printing ink, i.e. the size of printed spots did not change during the printing process. Micro-Shore-A hardness was determined on the larger relief spots. Again, these values were in the range typical for flexographic printing: 67 and 68 Shore A. The Micro-Shore-A hardness of the surface of a flexographic printing plate (nyloflex ACE 1.7 mm from Flint Group) subjected to standard prior art irradiation and leach-out procedures is 64.

The experiment confirms that the diffusion process of the invention can achieve additive build-up of relief printing plates typically used in flexographic printing and that the process of the invention provides flexographic printing plates with the necessary softness and resilience and resistance to swelling.

What is claimed is:

1. A process for the production of relief printing plates, where a carrier with a polymeric substrate layer is provided and a relief is formed layer-by-layer on a surface of the substrate layer, where the relief is formed by means of the following steps in the specific order of a), b) and then c):
   a) single or multiple application of a liquid comprising, a reactive monomer with high diffusion velocity in the polymeric substrate layer is used first, and subsequently a different reactive monomer with a lower diffusion velocity in the polymeric substrate layer is used in a subsequent layer(s) wherein the reactive monomer is then changed to one with lower diffusion velocity for the more externally situated layers,
   b) diffusion of the reactive monomer into the polymeric substrate layer for a prescribed exposure time and
   c) hardening of the relief,
   where in step a) the liquid is applied in accordance with an image to the surface and where, after the prescribed exposure time of step b), any liquid that remains on the surface, having not diffused into the material, is removed from the surface before step c), and in step c) the relief that is hardened comprises the polymer of the substrate layer and reactive monomer that has diffused into the material, and
   the selection of the reactive monomer of the liquid and selection of the polymeric substrate layer are such that the diffusion velocity of the reactive monomer in the polymeric substrate layer is in the range from 0.5 µm/min to 100 µm/min.

2. A process for the production of relief printing plates, where a carrier with a polymeric substrate layer is provided and a relief is formed layer-by-layer on a surface of the substrate layer, where the relief is formed by means of the following steps in the specific order of a), b) and then c):
   a) single or multiple application of a liquid comprising a reactive monomer with high diffusion velocity in the polymeric substrate layer is used first, and subsequently a different reactive monomer with a lower diffusion velocity in the polymeric substrate layer is used in a subsequent layer(s) wherein the reactive monomer is then changed to one with lower diffusion velocity for the more externally situated layers,
   b) diffusion of the reactive monomer into the polymeric substrate layer for a prescribed exposure time and
   c) hardening of the relief,
   where in step a) the liquid is applied in accordance with an image to the surface and where, after the prescribed exposure time of step b), any liquid that remains on the surface, having not diffused into the material, is removed from the surface before step c), and in step c) the relief that is hardened comprises the polymer of the substrate layer and reactive monomer that has diffused into the material, and
   wherein the proportion of the at least one reactive monomer present in the liquid is from 80% by weight to 100% by weight.

3. The process as claimed in claim 2, characterized in that the steps a) to c) are implemented only once with, in step a), only single application of the liquid.

4. The process as claimed in claim 2, characterized in that the steps a) and b) are implemented from 2 to 100 times and hardening in step c) takes place after the final implementation of the step b).

5. The process as claimed in claim 4, characterized in that the step c) is also executed after every nth implementation of the steps a) and b), following the step b), where n is from 2 to 10.

6. The process as claimed in claim 2, characterized in that the liquid is applied via application of a mask to the surface and application of the liquid through the mask, where the liquid reaches the unmasked portions of the surface, and where the design of the mask is such that a prescribed replicated image is produced.

7. The process as claimed in claim 2, characterized in that the liquid comprises further components selected from the group consisting of photoinitiators, plasticizers, emulsifiers, diffusion aids, solvents and surface-active substances.

8. The process as claimed in claim 2, where the reactive monomer is an ester or an amide of acrylic acid or methacrylic acid with mono- or polyfunctional alcohols, amines, aminoalcohols hydroxyethers, hydroxyesters an ester of fumaric or maleic acid, or an allyl compound.

9. The process as claimed in claim 2, characterized in that the polymer of the polymeric substrate layer is selected from the group consisting of styrene-butadiene-styrene (SBS), styrene-isoprene-styrene (SIS), styrene-butadiene/styrene-styrene, styrene-isoprene-butadiene-styrene (SIBS) and styrene-butadiene (SB) block copolymers and ethylene-propylene-diene rubber (EPDM).

10. The process as claimed in claim 2, characterized in that the polymer of the polymeric substrate layer is selected from polyvinyl alcohol, partially or highly hydrolyzed polyvinyl acetates and polyamide.

11. The process as claimed in claim 2, characterized in that the substrate layer is free from reactive monomer or comprises less than 10% by weight of reactive monomer.

12. The process as claimed in claim 2, characterized in that the substrate layer comprises a plasticizer selected from white oil, butadiene oil, liquid polyisoprene, high-boiling-point esters and paraffin oil.

13. The process as claimed in claim 2, characterized in that the substrate layer comprises one or more photoinitiators.

14. The process as claimed in claim 13, characterized in that the liquid is free from photoinitiators.

15. The process as claimed in claim 13, characterized in that the exposure time is in the range from 10 seconds to 3600 seconds.

16. The process as claimed in claim 2, characterized in that the carrier is composite material comprising at least one dimensionally stable carrier sheet and the substrate layer.

17. The process as claimed in claim 2, characterized in that the hardening in step c) takes place via exposure to UV radiation.

18. The process as claimed in claim 2, characterized in that the carrier provided takes the form of a cylinder sleeve.

19. A relief printing plate obtained according to the method of claim 2.

20. The process as claimed in claim 2, wherein the proportion of the at least one reactive monomer present in the liquid is more than 90% by weight.

21. The process as claimed in claim 20, wherein the selection of the reactive monomer of the liquid and selection of the polymeric substrate layer are such that the diffusion velocity of the reactive monomer in the polymeric substrate layer is in the range from 0.5 μm/min to 100 μm/min.

22. A process for the production of relief printing plates, where a carrier with a polymeric substrate layer is provided and a relief is formed layer-by-layer on a surface of the substrate layer, where the relief is formed by means of the following steps in the specific order of a), b) and then c):

a) single or multiple application of a liquid comprising a reactive monomer with high diffusion velocity in the polymeric substrate layer is used first, and subsequently a different reactive monomer with a lower diffusion velocity in the polymeric substrate layer is used in a subsequent layer(s) wherein the reactive monomer is then changed to one with lower diffusion velocity for the more externally situated layers, b) diffusion of the reactive monomer into the polymeric substrate layer for a prescribed exposure time and c) hardening of the relief, where in step a) the liquid is applied in accordance with an image to the surface and where, after the prescribed exposure time of step b), any liquid that remains on the surface, having not diffused into the material, is removed from the surface before step c), and in step c) the relief that is hardened comprises the polymer of the substrate layer and reactive monomer that has diffused into the material, and wherein the polymer of the polymeric substrate layer is selected from polyvinyl alcohol, partially or highly hydrolyzed polyvinyl acetates and polyamide.

* * * * *